(12) United States Patent
Gruendler (10) Patent No.: US 11,726,114 B2
(45) Date of Patent: Aug. 15, 2023

(54) CURRENT SENSOR ELEMENT, CURRENT SENSOR UNIT, AND METHOD OF MEASURING A CURRENT

(71) Applicant: TE Connectivity Germany GmbH, Bensheim (DE)

(72) Inventor: Jens Gruendler, Speyer (DE)

(73) Assignee: TE Connectivity Germany GmbH, Bensheim (DE)

( * ) Notice: Subject to any disclaimer, the term of this patent is extended or adjusted under 35 U.S.C. 154(b) by 29 days.

(21) Appl. No.: 17/405,469

(22) Filed: Aug. 18, 2021

(65) Prior Publication Data

US 2022/0057438 A1 Feb. 24, 2022

(30) Foreign Application Priority Data

Aug. 20, 2020 (EP) ..................................... 20191880

(51) Int. Cl.
*G01R 19/00* (2006.01)
*G01R 31/3828* (2019.01)
(Continued)

(52) U.S. Cl.
CPC ......... *G01R 19/0092* (2013.01); *G01R 1/203* (2013.01); *G01R 19/32* (2013.01); *G01R 31/3828* (2019.01)

(58) Field of Classification Search
None
See application file for complete search history.

(56) References Cited

U.S. PATENT DOCUMENTS

| 5,446,372 A | 8/1995 | Berkcan |
| 2010/0102841 A1* | 4/2010 | Kawada ............. G01R 1/06733 324/754.01 |

(Continued)

FOREIGN PATENT DOCUMENTS

| CN | 205809158 U | 12/2016 |
| DE | 10 2019 203 496 B3 | 7/2020 |

(Continued)

OTHER PUBLICATIONS

Extended European Search Report, European Application No. 20191880. 2-1010, European Filing Date, dated Feb. 10, 2021.

*Primary Examiner* — Jas A Sanghera
(74) *Attorney, Agent, or Firm* — Barley Snyder (57) ABSTRACT

A current sensor element includes a resistance section, a first electrically conductive connection section connected to a first end of the resistance section and having a first voltage measurement contact, and a second electrically conductive connection section connected to a second end of the resistance section and having a second voltage measurement contact and a third voltage measurement contact. The first electrically conductive connection section and the second electrically conductive connection section are connectable to feed a current to be measured through the resistance section. The first voltage measurement contact, the second voltage measurement contact, and the third voltage measurement contact are arranged in a way that a first resistance between the first voltage measurement contact and the second voltage measurement contact is smaller than a second resistance between the first voltage measurement contact and the third voltage measurement contact.

19 Claims, 7 Drawing Sheets

(51) Int. Cl.
  *G01R 1/20* (2006.01)
  *G01R 19/32* (2006.01)

(56) References Cited

U.S. PATENT DOCUMENTS

| | | |
|---|---|---|
| 2016/0077135 A1* | 3/2016 | Jockel .................... G01R 19/32 |
| | | 324/105 |
| 2020/0292588 A1 | 9/2020 | Mueller |
| 2020/0292589 A1 | 9/2020 | Kraemer et al. |
| 2021/0190834 A1* | 6/2021 | Endo ........................ G01R 1/30 |

FOREIGN PATENT DOCUMENTS

| | | |
|---|---|---|
| DE | 10 2019 203 498 B3 | 7/2020 |
| EP | 0605800 A1 | 7/1994 |
| EP | 1252526 A1 | 10/2002 |
| EP | 2811305 A1 | 12/2014 |

* cited by examiner

CURRENT SENSOR ELEMENT, CURRENT SENSOR UNIT, AND METHOD OF MEASURING A CURRENT

CROSS-REFERENCE TO RELATED APPLICATIONS

This application claims the benefit of the filing date under 35 U.S.C. § 119(a)-(d) of European Patent Application No. 20191880, filed on Aug. 20, 2020.

FIELD OF THE INVENTION

The present invention relates to a current sensor element, a current sensor unit, and a method of measuring an electrical current, especially for measuring a battery current in a motor vehicle on-board electrical system.

BACKGROUND

A so-called shunt current sensor, also referred to as current-sense resistor, is used to measure a current flowing through a busbar in a range of several hundred Amperes, for instance, in applications for electric vehicles (EV). The electrical current, voltage, and temperature at connectors of a vehicle battery are to be measured precisely in order to evaluate the charging state, the aging state, and the performance of the battery and to provide status information of the battery to an electronic control unit (ECU).

Figure 10:
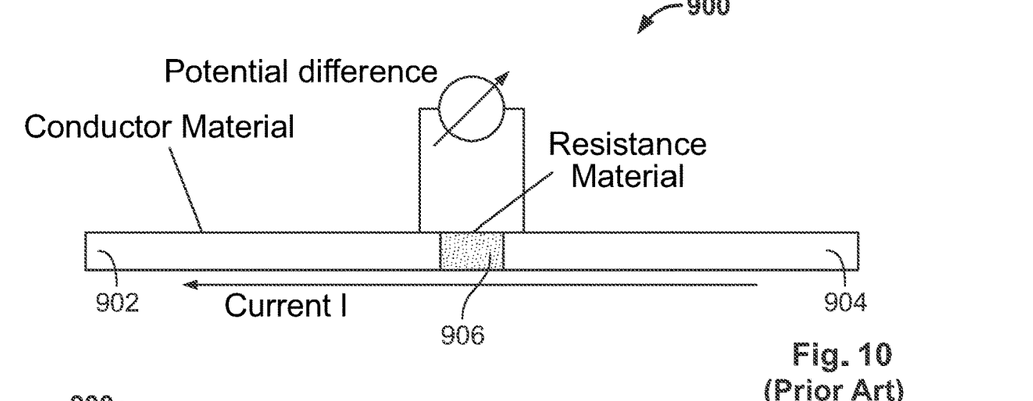
FIG. 10 is a schematic diagram of a current sensor unit according to the prior art.

FIG. 10 illustrates in a side view a conventional current sensor element 900 with a first conductor material 902 and a second conductor material 904. A resistance material 906 connects the first and second conductor material 902, 904. The shunt current sensor 900 allows for measuring the current I flowing through the busbars in a range of several hundred Amperes in applications for electric vehicles. The output signal is the potential difference between two contacts on both sides of the resistance material 906. In this 4-point-measurement, the influences of other potentials or resistances are effectively suppressed. The key feature of any shunt current sensor is the temperature coefficient (TC), as it determines the sensor's measurement error, the change of resistance related to the reference temperature. As the contacts are placed in the busbar, there are contributions to the TC from the resistance material and the conductor material in the contact region.

Figure 11:
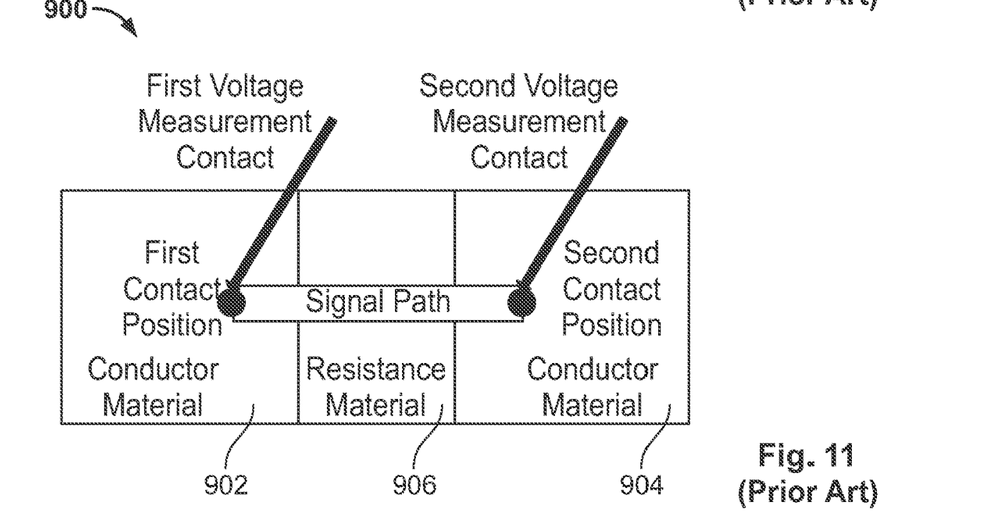
FIG. 11 is another schematic diagram of a current sensor unit according to the prior art.
Figure 12:
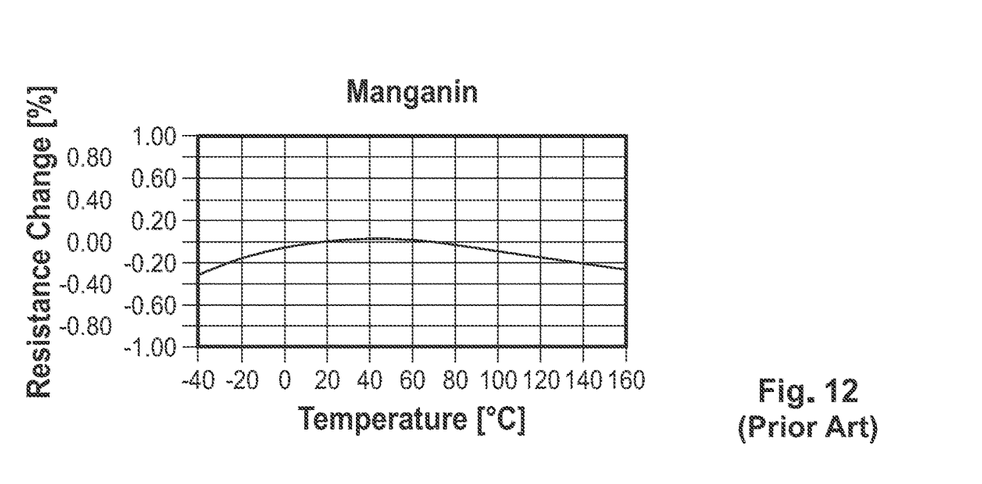
FIG. 12 is a graph of a resistance change of Manganin® over the temperature.
Figure 13:
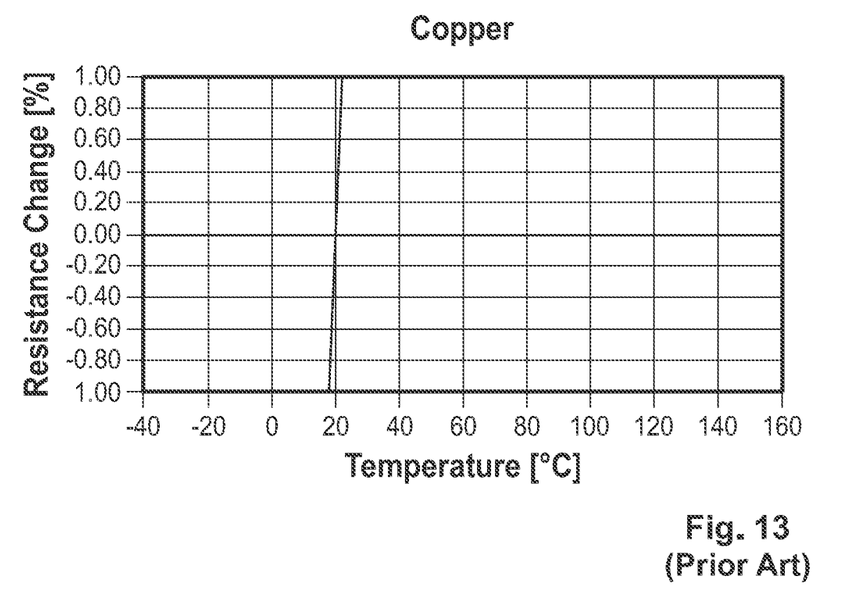
FIG. 13 is a graph of a resistance change of copper over the temperature.
Figure 14:
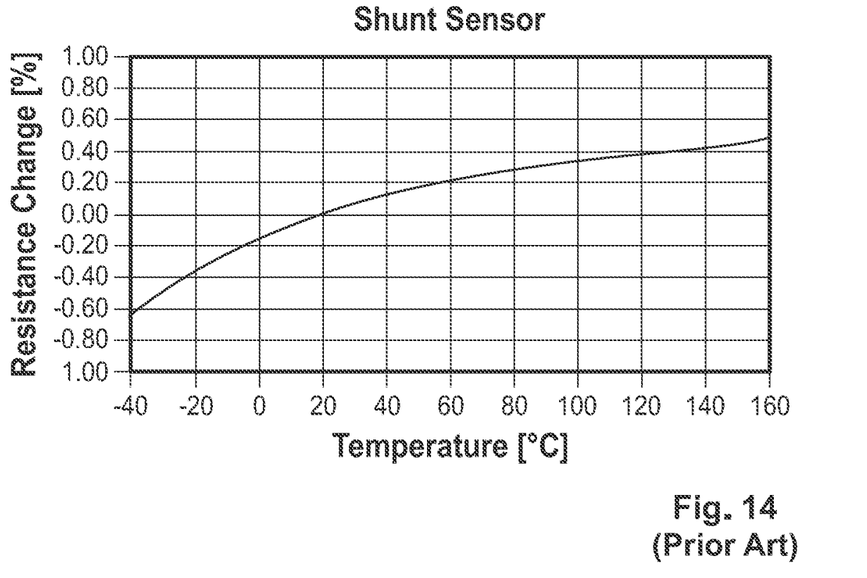
FIG. 14 is a graph of a resistance change of a shunt sensor configuration according to the prior art over the temperature.

FIG. 11 shows a top view of the conventional current sensor element 900 with two contact positions in more detail. The resistance between the two contact positions and (along the signal path) changes significantly over the temperature. When using copper as the first and second conductor material 902, 904 and Manganin® as the resistance material 906 in the arrangement of FIG. 11, the resistance changes shown in FIGS. 12 to 14 can be observed for Manganin®, copper, and the complete shunt sensor 900, respectively.

The published European patent application EP 0 605 800 A1 discloses a current-sense resistor, which consists of two copper plate-shaped connecting parts and an also plate-shaped low-ohm resistance element made of a resistance alloy (e.g. Cu84Ni4Mn12), wherein the resistance element is placed between the connecting parts and welded to the connecting parts. Such current-sense resistors are used to measure the electrical current as per the well-known four-wire technology, wherein the current to be measured is conducted through the resistance element via the plate-shaped connecting parts. The voltage drop over the resistance element then forms a measure for the electrical current to be measured in accordance with Ohm's law. The known current-sense resistor consequently has two voltage contacts on both plate-shaped connecting parts with the voltage contacts arranged near the resistance element and thus allowing a measurement of the voltage drop over the resistance element.

Such current-sense resistors exhibit only a relatively low temperature dependency of the measurement, since, usually, the resistance material used (e.g. Cu84Ni4Mn12) has a very low temperature coefficient. However, the demands on temperature constancy of such current-sense resistors are still increasing. In particular, the conductor material (e.g. copper) of the preferably plate-shaped connecting parts has a much higher temperature coefficient than the resistance material (e.g. Cu84Ni4Mn12) of the preferably plate-shaped resistance element. During the measuring of the electrical current that drops over the resistance element between both voltage contacts, there is, however, also an influence on the measurement caused by the material of the connecting parts. The temperature dependency of the voltage measurement thus is not only determined by the temperature coefficient of the resistance material, but also by the temperature coefficient of the conductor material. Here, it is important to take into consideration that the temperature coefficient of copper, for example, is $\alpha=3.9 \cdot 10^{-3}$ $K^{-1}$ and thus greater by a factor of 195 than the temperature coefficient of Cu84Ni4Mn12 (Manganin®) with $\alpha=0.02 \cdot 10^{-3}$ $K^{-1}$. It should be noted that the temperature coefficient of Manganin® is not linear, but that this value is an estimation for a given temperature range. Due to the much greater temperature coefficient of copper, the plate-shaped connecting parts actually influence the temperature dependency of the entire measurement if only a small part of the voltage between the voltage contacts drops over the connecting parts.

Further examples of such shunt current sensors can be found for instance in the published German patents DE 10 2019 203 498 B3 and DE 10 2019 203 496 B3.

As mentioned above, the output signal of a known shunt current sensor is based on the potential difference between two contacts on both sides of the resistance material. By this 4-point-measurement, the influences of other potentials or resistances are effectively suppressed. As the measurement contacts are placed on the conductor material, there are contributions to the resistance and thereby to the temperature coefficient (TC) of the resistance material and the conductor material. This is a limiting factor for the performance of conventional shunt current sensors.

SUMMARY

A current sensor element includes a resistance section, a first electrically conductive connection section connected to a first end of the resistance section and having a first voltage measurement contact, and a second electrically conductive connection section connected to a second end of the resistance section and having a second voltage measurement contact and a third voltage measurement contact. The first electrically conductive connection section and the second electrically conductive connection section are connectable to feed a current to be measured through the resistance section. The first voltage measurement contact, the second voltage measurement contact, and the third voltage measurement contact are arranged in a way that a first resistance between the first voltage measurement contact and the second voltage measurement contact is smaller than a second resistance between the first voltage measurement contact and the third voltage measurement contact.

BRIEF DESCRIPTION OF THE DRAWINGS

The invention will now be described by way of example with reference to the accompanying Figures, of which.

DETAILED DESCRIPTION OF THE EMBODIMENT(S)

The accompanying drawings are incorporated into the specification and form a part of the specification to illustrate several embodiments of the present invention. These drawings, together with the description, serve to explain the principles of the invention. The drawings are merely for the purpose of illustrating examples of how the invention can be made and used, and are not to be construed as limiting the invention to only the illustrated and described embodiments. Furthermore, several aspects of the embodiments may form—individually or in different combinations—solutions according to the present invention. The following described embodiments thus can be considered either alone or in an arbitrary combination thereof. Further features and advantages will become apparent from the following more particular description of the various embodiments of the invention, as illustrated in the accompanying drawings, in which like references refer to like elements.

Figure 1:
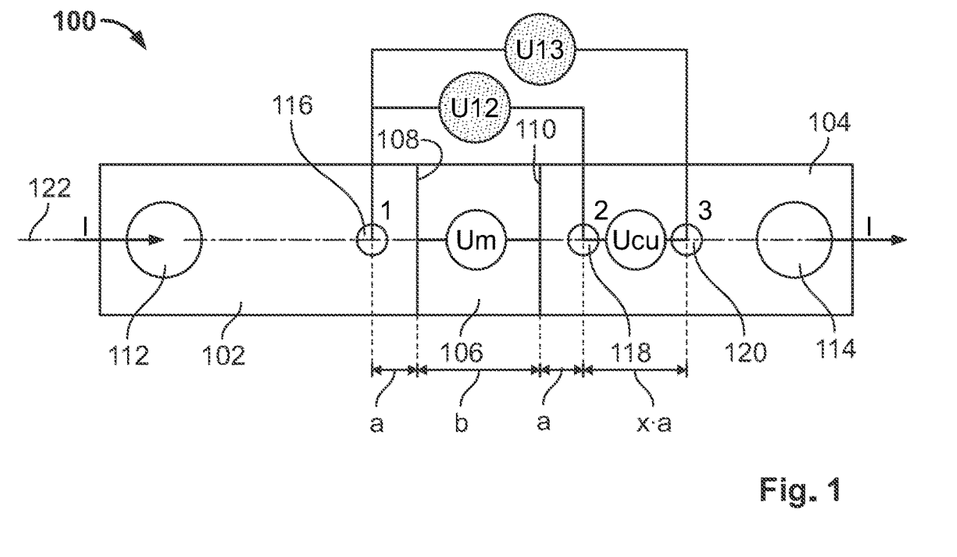
FIG. 1 is a schematic diagram of a current sensor element according to an embodiment.

The present invention will now be further explained referring to the Figures, and firstly referring to FIG. 1. FIG. 1 schematically illustrates in a schematic top view a current sensor element 100 according to a first aspect of the present disclosure.

The current sensor element 100 comprises a first electrically conductive connection section 102, which will also be referred to as a first busbar in the following. A current I to be measured can be fed into the first busbar 102 as indicated by the current arrow. Of course, the direction of the electrical current is arbitrary. Furthermore, a second electrically conductive connection section 104 is provided for leading out the electrical current I to be measured.

The first busbar 102 has a first current feeding contact 112 and the second busbar 104 has a second current feeding contact 114. The current feeding contacts 112, 114 are formed as openings which may for instance be screwed to a further electric component such as a terminal clamp of a battery and the busbar leading away from the battery. Of course, the busbars can also be welded to the current feeding contacts 112, 114.

As shown in FIG. 1, a resistance section 106 is arranged between the first and the second electrically conductive connection sections 102, 104. A first interface 108 between the first electrically conductive connection section 102 and the resistance section 106 as well as a second interface 110 between the resistance section 106 and the second electrically conductive connection section 104 may for instance be formed by a welded connection.

In an embodiment, the resistance section 106 comprises a resistance material comprising an alloy containing Cu, Mn, and/or Ni. For instance, the low resistance precision alloy Cu84Ni4Mn12 (Manganin®, a trademark of the company Isabellenhütte) may be used. Although in the following it will always be assumed that the resistance element is formed from Manganin®, it is clear for a person skilled in the art that any other suitable low resistance low temperature coefficient material may also be used for the current sensor element 100 according to the present disclosure. Other high precision low resistance resistive materials with a low temperature coefficient can be used, such as for instance Constantan® (a trademark of the company VDM Metals). As shown in FIG. 1, the resistance section 106 has a longitudinal width designated as b. Further, according to the examples shown in the present disclosure, the first and second electrically conductive connection sections (i. e. the first and second busbars) 102, 104 are fabricated from copper. Of course, they do not necessarily have to be formed both from the same material and also other highly conductive materials, such as metals and metal alloys, for instance aluminum, may also be used. The current sensor element 100 can be fixed directly at current carrying leads, for instance at a terminal clamp of a battery.

In order to determine a current I flowing through the current sensor element 100, it is sufficient according to the present invention to provide three voltage measurement contacts. In particular, a first voltage measurement contact 116 is arranged on the first busbar 102. Further, a second voltage measurement contact 118 and a third voltage measurement contact 120 are arranged on the second busbar 104. The three voltage measurement contacts 116, 118, 120 are arranged along one line (in FIG. 1, this a the longitudinal axis 122 of the current sensor element 100). However, the line does not have to be at a symmetric position, but may also be off center or at an angle with the central axis. The three voltage measurement contacts 116, 118, 120 are arranged in a way that the resistance between first and the second voltage measurement contact 116, 118 is smaller than the resistance between the first and the third voltage measurement contact 116, 120.

In an embodiment, the first, the second and the third measurement contact 116, 118, 120 are arranged along a straight line. In the shown embodiment, the current feeding contacts 112, 113 are arranged along the straight line.

The voltage measurement contacts 116, 118, 120 in the embodiment of FIG. 1 are shown only schematically because they may be formed by any suitable contacting technique. For instance, the voltage measurement contacts

116, 118, 120 may comprise welded pins, solder pins, press-fit pins, and/or protrusions for abuttingly contacting spring contacts. In particular, when providing protrusions, the principles of German patents DE 10 2019 203 498 B3 or DE 10 2019 203 496 B3 can be used to provide a facilitated contacting by an external connector.

In the embodiment shown in FIG. 1, the first voltage measurement contact 116 is distanced away from the first interface 108 by a distance indicated as a. Further, the second voltage measurement contact 118 is distanced away from the second interface 110 by the same distance a. The third voltage measurement contact 120 is arranged on the second busbar 104 distanced away from the second voltage measurement contact 118 by the multiple x of the distance a. As schematically indicated in FIG. 1, the voltage drop across the resistance section 106 is $U_M$ and the voltage drop between the second voltage measurement contact 118 and the third voltage measurement contact 120 is $U_{Cu}$. For calculating these voltages, the potential difference $U_{12}$ between the first and second voltage measurement contacts 116, 118 and the potential difference $U_{13}$ between the first voltage measurement contact 116 and the third voltage measurement contact 120 is measured.

Figure 2:
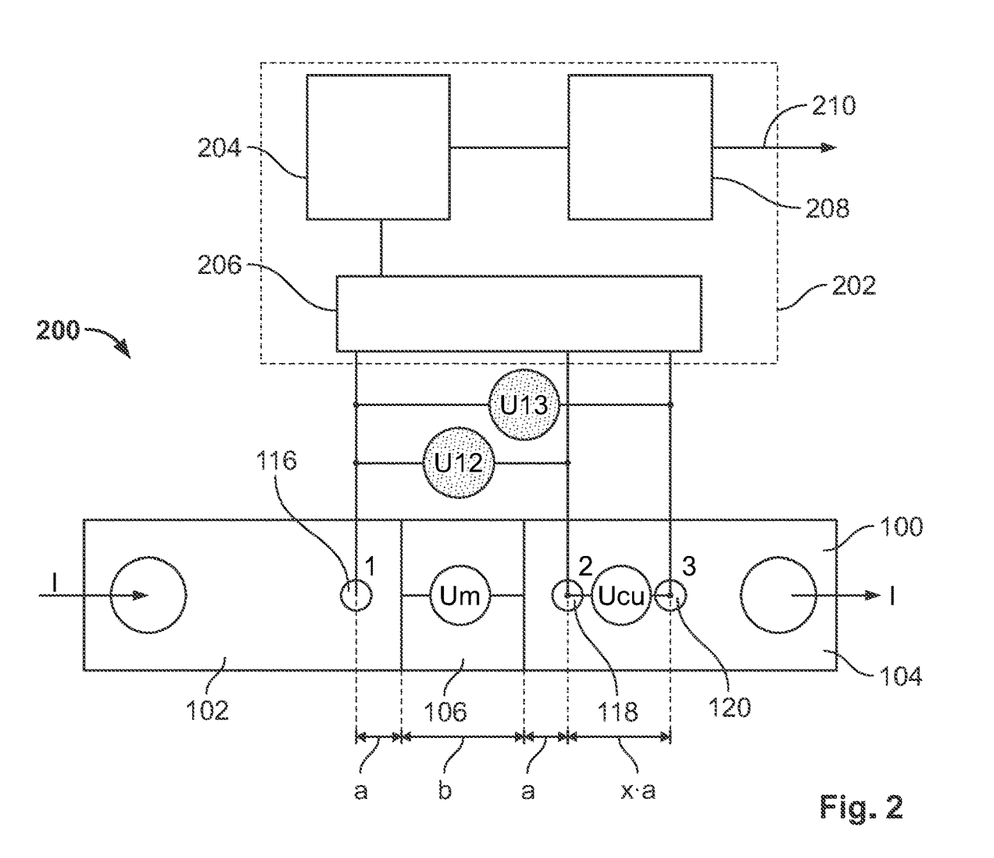
FIG. 2 is a schematic diagram of a current sensor unit according to an embodiment.

FIG. 2 shows a current sensor unit 200 comprising a current sensor element 100 as shown in FIG. 1 and an electronic control unit 202 for measuring the first voltage difference $U_{12}$ and the second voltage difference $U_{13}$, and for calculating the current I therefrom. The electronic control unit 202 comprises a voltage measuring unit 204. In the shown example, the voltage measuring unit 204 is connected to the first, second, and third voltage measurement contacts 116, 118, 120 via a multiplexer unit 206. Such a configuration may avoid that the first voltage difference $U_{12}$ and the second voltage difference $U_{13}$ are measured by two different voltage measuring circuits which might differ in their operational parameters and might cause systematic errors in the measurement.

The electronic control unit 202 may be situated close to the measurement contacts 116, 118, 120, so that the current sensor unit 200 forms a compact integrated module which is able to communicate with an ECU via cable bound and/or wireless communication. Alternatively, the electronic control unit 202 is formed by a separate entity, while the current sensor element 100 is provided only with a communication interface to connect the current sensor element 100 in a cable bound and/or wireless manner to the electronic control unit 202. Any combination of these alternatives is of course also possible.

The electronic control unit 202 further comprises an evaluation unit 208, as shown in FIG. 2, which performs the necessary calculations and generates an output signal 210. Furthermore, the evaluation unit 208 stores the parameters gained from a calibration measurement.

The first voltage difference $U_{12}$ and the second voltage difference $U_{13}$ are correlated with the voltage difference $U_M$ across the resistance section 106 by equations (1) and (2) explained above:

$$U_{12} = U_M + (2/x) \cdot U_{Cu} \tag{1}$$

wherein:
$U_{12}$: voltage difference between the first voltage measurement contact and the second voltage measurement contact
$U_{Cu}$: voltage difference over the distance x·a in the busbar (e. g. comprising copper)
$U_M$: voltage difference over the resistance material (e. g. Manganin®)

Further, the second voltage difference $U_{13}$ can be expressed according to equation (2):

$$U_{13} = U_M + [(2/x)+1] \cdot U_{Cu} = U_{12} + U_{Cu} \tag{2}$$

wherein:
$U_{13}$: voltage difference between the first voltage measurement contact and the third voltage measurement contact
a: distance between the first voltage measurement contact and the resistance material and distance between the second voltage measurement contact and the resistance material
x·a: distance between the second voltage measurement contact and the third voltage measurement contact for the particular case where the first the second and the third voltage measurement contact are in line in an advantageous arrangement.

From equations (1) and (2) the following equation (3) can be derived:

$$U_M = \left(1 + \frac{2}{x}\right) \cdot U_{12} - \frac{2}{x} \cdot U_{13} \tag{3}$$

For the specific example of x being 4 (e. g. a=1 mm and x·a=4 mm), the above equation (3) becomes the following equation (9):

$$U_M = 3/2 \cdot U_{12} - 1/2 \cdot U_{13} \tag{9}$$

Again, Ohm's law is used for calculating I:

$$I = \frac{U_M}{R} \tag{4}$$

wherein:
R: total resistance of the resistance section, as determined by calibration step.

It should be noted that the above described particular geometry facilitates the calculation, but does not necessarily have to be used for taking advantage of the principle according to the present disclosure. Of course, the calculation may also be made with any other arbitrary distances, as long as the third voltage measurement contact is located further away from the resistance section than the second voltage measurement contact.

As mentioned above, the arrangement having three voltage measurement contacts 116, 118, 120 allows the calculation of the temperature at the second busbar 104. In particular, the third voltage difference $U_{Cu}$ between the second and the third voltage measurement contact 118, 120 is given by equation (5) as follows.

$$U_{Cu} = U_{13} - U_{12} \tag{5}$$

wherein:
$U_{Cu}$: potential difference over the second distance x·a in the second busbar 104 (e. g. made from copper)

The resistance of the second electrically conductive connection section 104 can be calculated from the measured current using Ohm's law as given by the following equation (6).

$$R_{Cu} = \frac{U_{Cu}}{I} \tag{6}$$

wherein:

$R_{Cu}$: resistance of the second electrically conductive connection section

Any electrical resistance is a function of the temperature and the dependence on the temperature can be given by using the linear temperature coefficient of the second electrically conductive connection section 104 (e. g. copper) according to the following equation (7).

$$R(T)=R(T_0)\cdot[1+\alpha\cdot(T-T_0)] \quad (7)$$

wherein:

R(T): electrical resistance

α: linear temperature coefficient of the second electrically conductive connection section (0.0037 for copper)

T: temperature of the material of the second electrically conductive connection section between the second and third voltage measurement contact at the time of measurement $T_0$: Temperature at which a calibration step is performed (e. g. 20° C.)

Thus, the temperature T can be calculated from the following equation (8).

$$T = T_0 + \left[\frac{\frac{R_{Cu}(T)}{R_{Cu}(T_0)} - 1}{\alpha}\right] \quad (8)$$

wherein:

$R_{Cu}(T)$: resistance of the second electrically conductive connection section between the second and the third voltage measurement contacts at the time of measurement $R_{Cu}(T_0)$: resistance of the second electrically conductive connection section between the second and the third voltage measurement contacts at the calibration temperature (e. g. 20° C.)

Thus, for calculating the temperature, the only input parameters needed are the two voltage differences $U_{12}$ and $U_{13}$, the linear temperature coefficient α, the two voltage differences $U_{12}$ and $U_{13}$ at a calibration temperature, and the distance parameters. It should be noted that also additional voltage measurement contacts can be provided in order to perform redundant measurement.

In a non-linear arrangement, the correction function will be the same as with an arrangement along a straight line with slightly different parameters "a" and "x", but it can be determined in a development phase. For example, for a redundant current measurement with two signal paths for measuring the voltage difference between the first and the second voltage measurement contact 116, 118, one additional pin further away from the resistance material 106 could be used to generate the correction for both redundant signals, even though they are not in a straight line.

In an embodiment, the electronic control unit 200 may comprise a storing unit for storing a value of the temperature coefficient of the second electrically conductive connection section 104, wherein the evaluation unit 208 is further operable to calculate a third voltage difference between the second and the third voltage measurement contact 118, 120 and to calculate a temperature of the second electrically conductive connection section 104 from the third voltage difference using the stored value of the temperature coefficient of the second electrically conductive connection section 104. The temperature of the second electrically conductive connection section 104 is indicative of the temperature present at the direct environment of the current sensor element 100, e. g. a battery contact. Advantageously, no additional temperature sensor is needed, so that the complexity and costs can be kept low, at the same time enhancing the safety. It could in particular be shown that the temperature gradient in a busbar is small, even in high dynamic situations. Therefore, this aspect offers the possibility of measuring the temperature of the busbar without a separate temperature sensor and without delay.

In an embodiment, the current sensor unit 200 may comprise an output interface for outputting the output signal 210, wherein the output interface is galvanically separated from the first and second electrically conductive connection sections 102, 104. The galvanic separation may be effected by any suitable elements, such as for instance optocouplers or the like.

Figure 3:
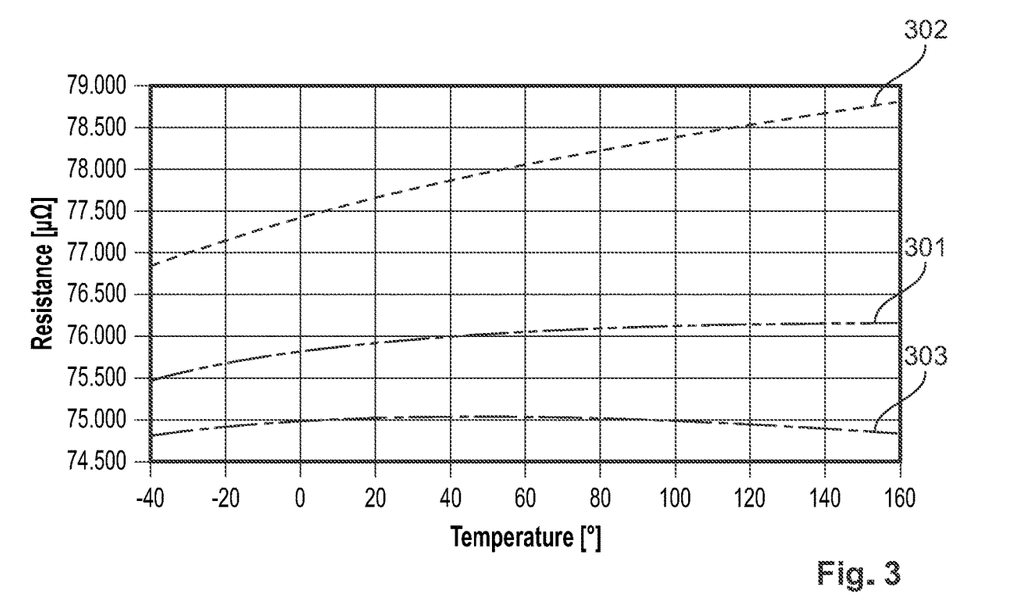
FIG. 3 is a graph of simulated resistance values as a function of the temperature.

FIG. 3 exemplarily shows resistance values as a function of the temperature for a current sensor element 100 wherein the resistance section 106 has a total nominal resistance of 75 μΩ. Curve 301 shows the resistance between the first and second voltage measurement contacts 116 and 118. Curve 302 shows the resistance between the first and the third voltage measurement contact 116 and 120. When using the measured first voltage difference $U_{12}$ and second voltage difference $U_{13}$, together with a predefined value of the current I, a calculated resistance $R_M$ can be derived which is depicted as curve 303.

Figure 4:
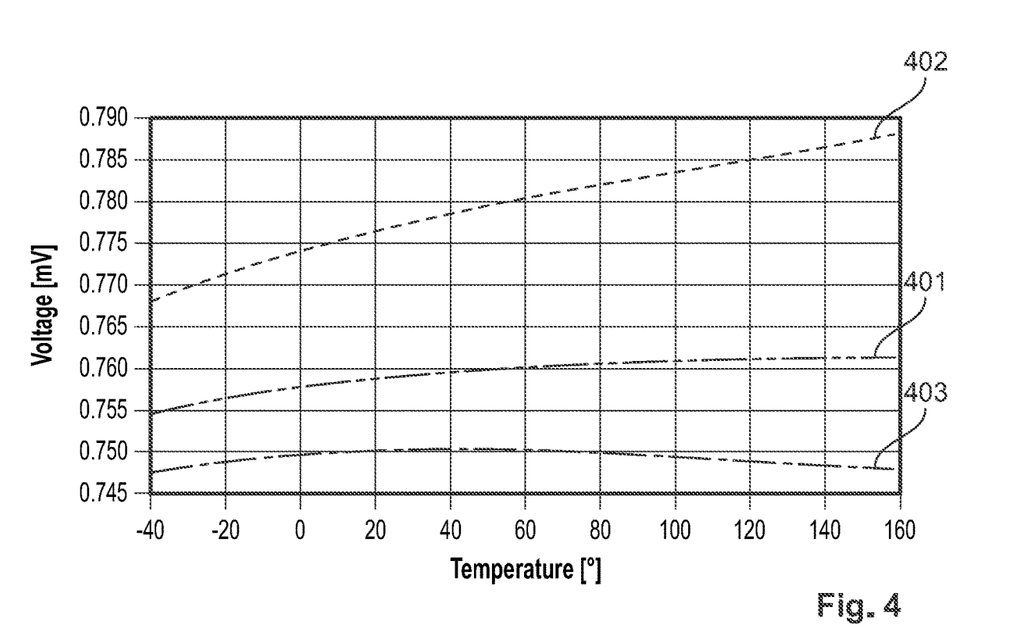
FIG. 4 is a graph of simulated voltage difference values as a function of the temperature.

Furthermore, FIG. 4 shows as a function of the temperature the first voltage difference $U_{12}$ (curve 401) and second voltage difference $U_{13}$ (curve 402) together with the calculated voltage drop $U_M$ (curve 403) across the resistance section 106.

Figure 5:
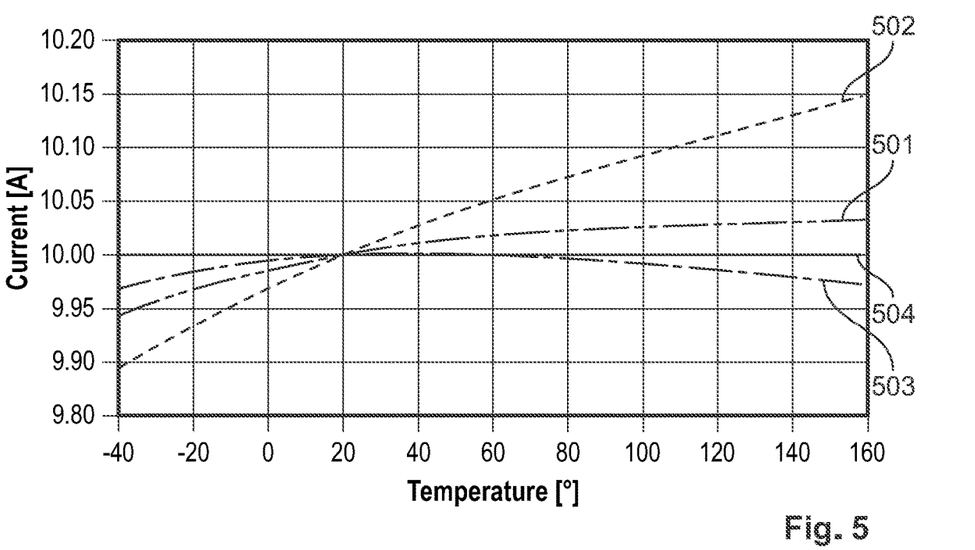
FIG. 5 is a graph of simulated current values as a function of the temperature.

FIG. 5 illustrates the current I as a function of the temperature as calculated from the total resistance between the first and the second voltage measurement contact 116, 118 (curve 501), between the first and the third voltage measurement contact 116, 120 (curve 502), and the total current as calculated (curve 503). Further, curve 504 indicates the constant line of a nominal current of 10 A.

Figure 6:
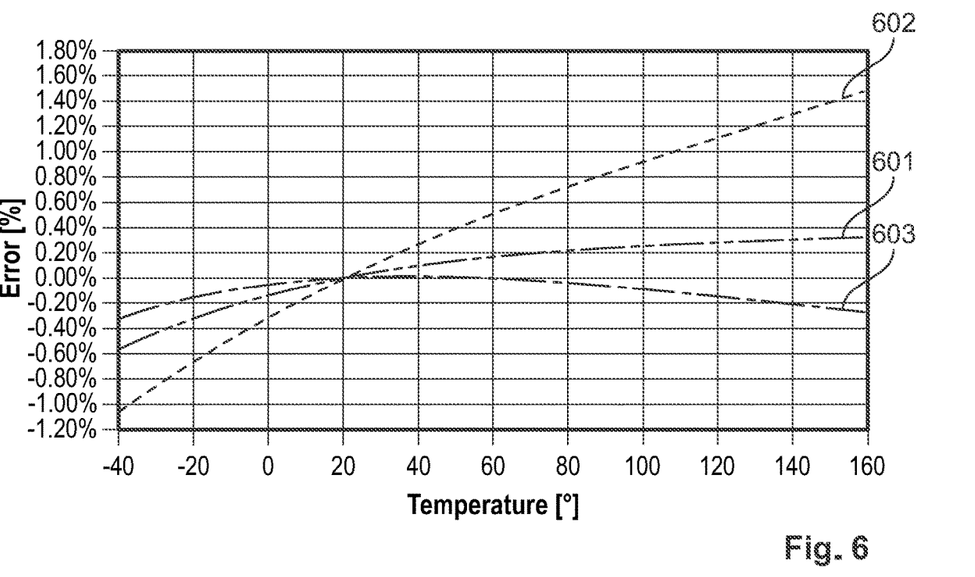
FIG. 6 is a graph of calculated current error values as a function of the temperature for a total resistance of 75 $\mu\Omega$.
Figure 7:
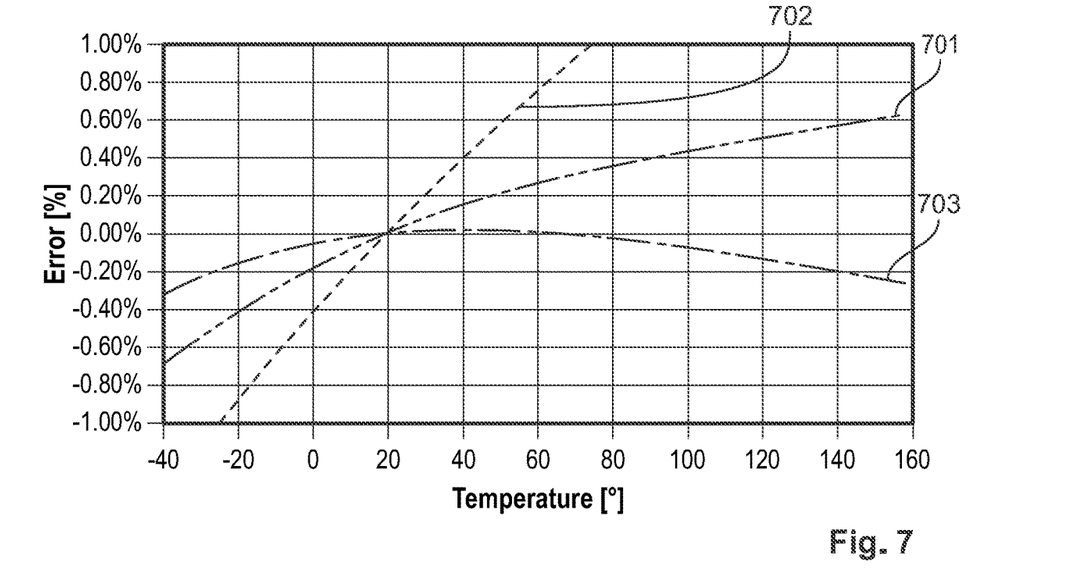
FIG. 7 is a graph of calculated current error values as a function of the temperature for a total resistance of 50 $\mu\Omega$.
Figure 8:
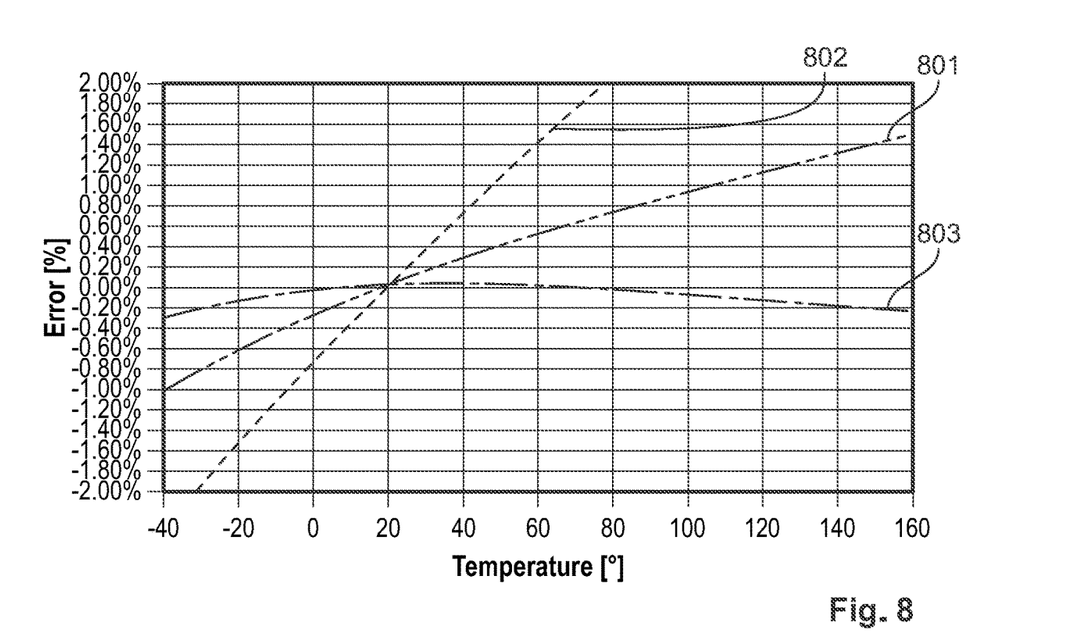
FIG. 8 is a graph of calculated current error values as a function of the temperature for a total resistance of 25 $\mu\Omega$.

FIGS. 6 to 8 illustrate estimations of the error in the measurement of the current for resistance values of the shunt resistance section 106 of 75 μΩ, 50 μΩ, and 25 μΩ, respectively. Clearly, the error in the calculated current has a low temperature sensitivity, so that the sensor output is accurate over a large range of temperatures.

As shown in FIG. 6 (for a resistance of the resistance section of 75 μΩ), the error is assumed to be zero for a temperature of 20° C., in case this is the calibration temperature. Curve 601 depicts the calculated error in a current measurement between the first and the second voltage measurement contact 116, 118. Curve 602 depicts the calculated error in the current measurement between the first and the third voltage measurement contact 116, 120. In contrast thereto, the current $I_M$ as calculated according to equations (4) and (9) has a much lower temperature dependency as can be seen from curve 603.

As shown in FIG. 7 (for a resistance of the resistance section of 50 μΩ), the error is assumed to be zero for a temperature of 20° C., in case this is the calibration temperature. Curve 701 depicts the calculated error in a current measurement between the first and the second voltage measurement contact 116, 118. Curve 702 depicts the calculated error in the current measurement between the first and the third voltage measurement contact 116, 120. In contrast thereto, the current $I_M$ as calculated according to equations (4) and (9) has a much lower temperature dependency as can be seen from curve 703.

Finally, as can be seen in FIG. 8 (for a resistance of the resistance section of 25 μΩ), the error is assumed to be zero for a temperature of 20° C., in case this is the calibration temperature. Curve 801 depicts the calculated error in a current measurement between the first and the second voltage measurement contact 116, 118. Curve 802 depicts the calculated error in the current measurement between the first and the third voltage measurement contact 116, 120. In contrast thereto, the current $I_M$ as calculated according to equations (4) and (9) has a much lower temperature dependency as can be seen from curve 803.

Figure 9:
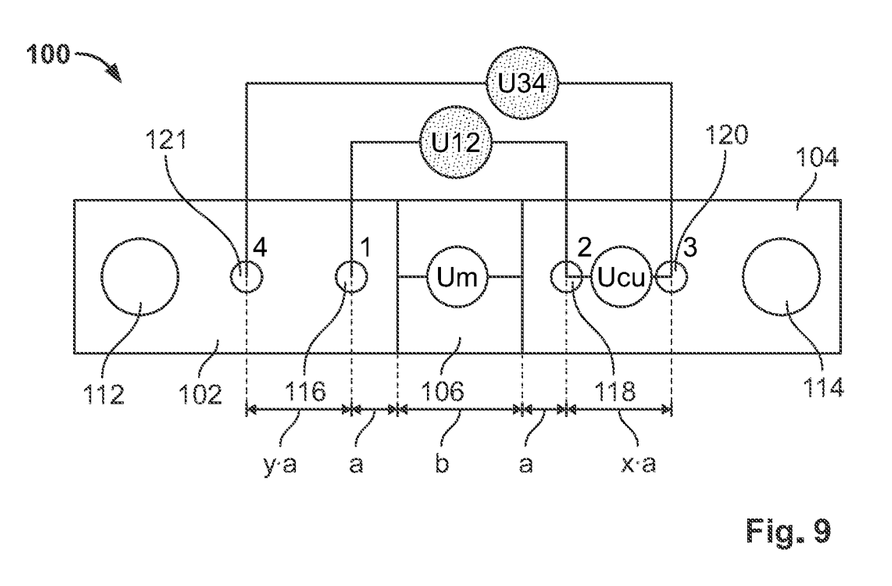
FIG. 9 is a schematic diagram of a current sensor element according to another embodiment.

FIG. 9 illustrates a schematic top view of a current sensor element 100 according to another embodiment of the present disclosure. According to this example, the current sensor element 100 comprises a fourth voltage measurement contact 121, which may be distanced from the first voltage measurement contact 116 by a multiple y of the distance a. For facilitating the calculations, y may be equal to x. In this arrangement, the two voltage differences that are measured are between the first voltage measurement contact 116 and the second voltage measurement contact 118, and further between the third voltage measurement contact 120 and the fourth voltage measurement contact 121. The equations for determining the resistances have to be adapted accordingly.

Furthermore, other arrangements of three or more voltage measurement contacts are of course also encompassed by the present disclosure. Moreover, it should be noted that for enhancing the accuracy when operating a current sensor according to the present disclosure, the distance parameters x and y can be determined in a calibration measurement. The distance parameters may deviate from the theoretical values due to a varying material thickness and the presence of welding zones at the first and second interfaces 108, 110. At such welding zones, a mixing of the involved materials occurs.

The present disclosure also relates to a method of measuring a current, the method comprising the following steps:

Connecting the current sensor element 100 with a current I to be measured, the current sensor element 100 has at least one resistance section 106 comprising a resistance material having a first specific electrical conductivity and a first temperature coefficient. The current sensor element 100 has the first electrically conductive connection section 102 connected to a first end of the resistance section 106, and a second electrically conductive connection section 104 connected to a second end of the resistance element 106, wherein the first and second connection sections 102, 104 each have a second specific electrical conductivity which is higher than the first electrical conductivity of the resistance material and a second temperature coefficient which is higher than the first temperature coefficient. The first and second connection sections 102, 104 are connected to feed the current to be measured through the resistance sections 106.

The method includes measuring a first voltage difference between a first voltage measurement contact 116 arranged on the first electrically conductive connection section 102 and a second voltage measurement contact 118 arranged on the second electrically conductive connection section 104.

The method includes measuring a second voltage difference between the first voltage measurement contact 116 and the third voltage measurement contact 120 arranged on the second electrically conductive connection section 104.

The method includes calculating a voltage drop over the resistance section 106 from the first and second voltage differences and calculating the current I to be measured from the voltage drop.

As mentioned above, this method has the advantage of being simple, cost effective, and at the same time safe. The only input parameters for the calculation of the current I to be measured are the two voltage differences, the initial resistances, which are measured and calculated in a calibration measurement from an initial value of the potential difference $U_{12}$ between the first and second voltage measurement contacts 116, 118 and an initial value of the potential difference $U_{13}$ between the first and third voltage measurement contacts 116, 120 at a known calibration temperature, and the distance parameters.

When additionally taking into account the linear temperature coefficient of the material of the second electrically conductive connection section 104 (e. g. copper or aluminum), the temperature of the electrically conductive connection section 104 can be calculated as well. In particular, the method may further comprise the following steps:

calculating a third voltage difference between the second and the third voltage measurement contact 118, 120 and calculating a temperature of the second electrically conductive connection section 118 from the third voltage difference using the stored value of the temperature coefficient of the second electrically conductive connection section 118.

It has to be noted that the above calculation of the temperature is only an exemplary advantageous configuration for conductive materials having a linear temperature coefficient. But the temperature can be calculated for every material, even if this material does not have a linear temperature coefficient. In that case, again, the voltage drop in the resistance material 106 can be calculated using equation (4) and the resistance can be calculated by equation (5). However, the temperature calculation is different, because equations (7) and (8) are approximations for conductive materials having a linear temperature coefficient, such as copper.

Thus, for calculating the temperature, the only input parameters needed are the two voltage differences, the linear temperature coefficient α and the initial resistances, which are measured and calculated in a calibration measurement from an initial value of the potential difference $U_{12}$ between the first and second voltage measurement contacts 116, 118 and an initial value of the potential difference $U_{13}$ between the first and third voltage measurement contacts 116, 120 at a known calibration temperature.

Of course, the design and manufacturing has to ensure low tolerances for the position of the three voltage measurement contacts 116, 118, 120. Furthermore, the resistance of the resistance material has to be measured in a one-point-calibration at the end of the manufacturing process. Thus, the method advantageously may comprise a calibration step performed at a defined calibration temperature, wherein the voltage differences between the first and the second voltage measurement contact 116, 118 and between the first and the third voltage measurement contact 116, 120 at calibration temperature are determined and stored.

In summary, by using the exemplary equations described above, the temperature coefficient of the resistance material could be reached, thus eliminating the influence of the temperature coefficient of the conductive material on the output signal. This reduces the measurement error close to the theoretical optimum of the resistance material.

What is claimed is:

1. A current sensor element, comprising:
   a resistance section comprising a resistance material having a first specific electrical conductivity and a first temperature coefficient;
   a first electrically conductive connection section connected to a first end of the resistance section and having a first voltage measurement contact;

a second electrically conductive connection section connected to a second end of the resistance section and having a second voltage measurement contact and a third voltage measurement contact, the first electrically conductive connection section and the second electrically conductive connection section each have a second specific electrical conductivity that is higher than the first specific electrical conductivity and a second temperature coefficient that is higher than the first temperature coefficient, the first electrically conductive connection section and the second electrically conductive connection section are connectable to feed a current to be measured through the resistance section, the first voltage measurement contact, the second voltage measurement contact, and the third voltage measurement contact are arranged in a way that a first resistance between the first voltage measurement contact and the second voltage measurement contact is smaller than a second resistance between the first voltage measurement contact and the third voltage measurement contact, whereby a voltage drop across the resistance section and a voltage drop between the second voltage measurement contact and the third voltage measurement contact is calculated by measuring the potential difference between the first and second voltage measurement contacts and the potential difference between the first voltage measurement contact and the third voltage measurement contact.

2. The current sensor element of claim 1, wherein the first voltage measurement contact, the second voltage measurement contact, and the third voltage measurement contact are arranged along a straight line.

3. The current sensor element of claim 2, wherein a first distance between the first voltage measurement contact and the second voltage measurement contact is smaller than a second distance between the first voltage measurement contact and the third voltage measurement contact.

4. The current sensor element of claim 1, wherein the first voltage measurement contact is distanced from a first interface between the first electrically conductive connection section and the resistance section by a first distance, and the second voltage measurement contact is distanced from a second interface between the second electrically conductive connection section and the resistance section by the first distance.

5. The current sensor element of claim 4, wherein the third voltage measurement contact is distanced from the second voltage measurement contact by a second distance which is a multiple of the first distance.

6. The current sensor element of claim 1, wherein the first electrically conductive connection section and the second electrically conductive connection section each have a current feeding contact.

7. The current sensor element of claim 6, wherein the first voltage measurement contact, the second voltage measurement contact, and the third voltage measurement contact are arranged along a straight line, the current feeding contact of each of the first electrically conductive connection section and the second electrically conductive connection section is arranged along the straight line.

8. The current sensor element of claim 1, wherein the resistance section comprises a material comprising an alloy containing Cu, Mn, and/or Ni.

9. The current sensor element of claim 1, wherein the first electrically conductive connection section and the second electrically conductive connection section each comprise a copper or aluminum busbar.

10. The current sensor element of claim 1, wherein the first voltage measurement contact, the second voltage measurement contact, and the third voltage measurement contact each comprise welded pins, soldered pins, pressfit pins, and/or protrusions for being abuttingly contacted by spring contacts.

11. A current sensor unit, comprising:
a current sensor element including a resistance section comprising a resistance material having a first specific electrical conductivity and a first temperature coefficient, a first electrically conductive connection section connected to a first end of the resistance section and having a first voltage measurement contact, and a second electrically conductive connection section connected to a second end of the resistance section and having a second voltage measurement contact and a third voltage measurement contact, the first electrically conductive connection section and the second electrically conductive connection section each have a second specific electrical conductivity that is higher than the first specific electrical conductivity and a second temperature coefficient that is higher than the first temperature coefficient, the first electrically conductive connection section and the second electrically conductive connection section are connectable to feed a current to be measured through the resistance section, the first voltage measurement contact, the second voltage measurement contact, and the third voltage measurement contact are arranged in a way that a first resistance between the first voltage measurement contact and the second voltage measurement contact is smaller than a second resistance between the first voltage measurement contact and the third voltage measurement contact; and
an electronic control unit generating an electrical output signal indicative of a current flowing through the resistance section, wherein the electronic control unit includes a voltage measuring unit measuring a first voltage difference between the first voltage measurement contact and the second voltage measurement contact, and measuring a second voltage difference between the first voltage measurement contact and the third voltage measurement contact.

12. The current sensor unit of claim 11, wherein the electronic control unit includes an evaluation unit calculating a voltage drop over the resistance section from the first voltage difference and the second voltage difference.

13. The current sensor unit of claim 12, wherein the electronic control unit includes a storing unit storing a value of the second temperature coefficient of the second electrically conductive connection section, the evaluation unit calculates a third voltage difference between the second voltage measurement contact and the third voltage measurement contact to calculate a temperature of the second electrically conductive connection section from the third voltage difference using the stored value of the second temperature coefficient.

14. The current sensor unit of claim 11, further comprising an output interface outputting the electrical output signal, the output interface is galvanically separated from the first electrically conductive connection section and the second electrically conductive connection section.

15. A method of measuring a current, comprising:
providing a current sensor element including a resistance section comprising a resistance material having a first specific electrical conductivity and a first temperature coefficient, a first electrically conductive connection section connected to a first end of the resistance section and having a first voltage measurement contact, and a second electrically conductive connection section connected to a second end of the resistance section and having a second voltage measurement contact and a third voltage measurement contact, the first electrically conductive connection section and the second electrically conductive connection section each have a second specific electrical conductivity that is higher than the first specific electrical conductivity and a second temperature coefficient that is higher than the first temperature coefficient;
connecting the current sensor element with a current to be measured, the first electrically conductive connection section and the second electrically conducive connection section are connected to feed the current through the resistance section;
measuring a first voltage difference between the first voltage measurement contact and the second voltage measurement contact;
measuring a second voltage difference between the first voltage measurement contact and the third voltage measurement contact;
calculating a voltage drop over the resistance section from the first voltage difference and the second voltage difference; and
calculating the current to be measured from the voltage drop.

16. The method of claim 15, further comprising:
calculating a third voltage difference between the second voltage measurement contact and the third voltage measurement contact; and
calculating a temperature of the second electrically conductive connection section from the third voltage difference using a stored value of the second temperature coefficient of the second electrically conductive connection section.

17. The method of claim 15, further comprising calibrating at a defined calibration temperature, a total resistance of the resistance section.

18. The method of claim 15, wherein the first voltage measurement contact is distanced from a first interface between the first electrically conductive connection section and the resistance section by a first distance, the second voltage measurement contact is distanced from a second interface between the second electrically conducive connection section and the resistance section by the first distance, and the third voltage measurement contact is distanced from the second voltage measurement contact by a second distance that is a multiple of the first distance, and the current to be measured is calculated from the following equation:

$$I = \left[\left(1 + \frac{2}{x}\right) \cdot U_{12} - \frac{2}{x} \cdot U_{13}\right] \div R$$

wherein I is the current to be measured, $U_{12}$ is the first voltage difference, $U_{13}$ is the second voltage difference, R is a resistance calculated in a calibration measurement from the first voltage difference and the second voltage difference at a known calibration current, and x is a multiplication factor of the first distance.

19. The method of claim 15, wherein the first voltage difference and the second voltage difference are measured using a multiplexer connected to a voltage measurement unit.

* * * * *